United States Patent
Gottwald

(10) Patent No.: US 6,995,314 B2
(45) Date of Patent: Feb. 7, 2006

(54) HF MODULE AND METHOD OF ASSEMBLING THE SAME

(75) Inventor: Frank Gottwald, Weissach (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 10/510,022

(22) PCT Filed: Nov. 19, 2003

(86) PCT No.: PCT/DE03/03890

§ 371 (c)(1),
(2), (4) Date: Oct. 1, 2004

(87) PCT Pub. No.: WO2004/059674

PCT Pub. Date: Jul. 15, 2004

(65) Prior Publication Data

US 2005/0224246 A1  Oct. 13, 2005

(30) Foreign Application Priority Data

Mar. 7, 2003  (DE) ............................ 103 09 949

(51) Int. Cl.
*H05K 9/00* (2006.01)

(52) U.S. Cl. .................. 174/35 GC; 174/35 R; 361/816

(58) Field of Classification Search ......... 174/35 R, 174/35 MS, 35 GC; 361/816, 818, 800
See application file for complete search history.

(56) References Cited

U.S. PATENT DOCUMENTS

| | | | | |
|---|---|---|---|---|
| 5,270,493 A | * | 12/1993 | Inoue et al. | 174/253 |
| 5,703,761 A | * | 12/1997 | Heiss | 361/800 |
| 6,366,245 B1 | | 4/2002 | Schmidt et al. | |
| 6,462,436 B1 | * | 10/2002 | Kay et al. | 307/91 |
| 6,600,103 B1 | | 7/2003 | Schmidt et al. | |
| 2005/0162842 A1 | * | 7/2005 | Muramatsu et al. | 361/818 |

FOREIGN PATENT DOCUMENTS

DE      196 44 164      4/1998

* cited by examiner

Primary Examiner—Hung V. Ngo
(74) Attorney, Agent, or Firm—Michael J. Striker

(57) ABSTRACT

The present invention relates to measures that enable simple assembly of a high-frequency (HF) module. The HF module includes a HF circuit board (1), on which at least one first antenna part (6) is located, a housing part (2), on which at least one second antenna part (7) is located, and a shielding cover (3), whereby the HF circuit board (1) is installed between the housing part (2) and the shielding cover (3). With the aid of the measures according to the present invention, the housing part (2) and the shielding cover (3) can be easily adjusted relative to the HF circuit board (1). A reliable connection between these three parts can also be achieved with relatively little outlay.

Figure 1:
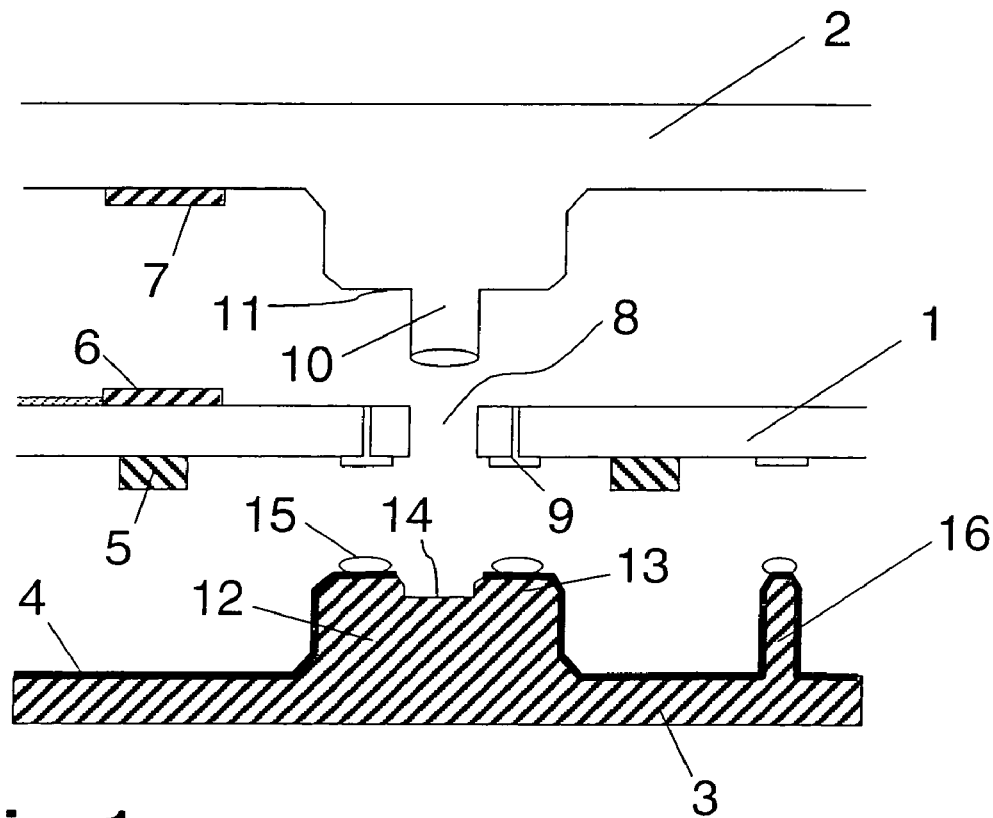

To this end, the HF circuit board (1) includes, according to the present invention, at least one through opening (8), while the housing part (2) has at least one peg (10) which extends into the through opening (8). The peg (10) is connected with the diametrically opposed surface (14) of the shielding cover (3).

11 Claims, 1 Drawing Sheet

HF MODULE AND METHOD OF ASSEMBLING THE SAME

BACKGROUND INFORMATION

The present invention concerns a high-frequency (HF) module with a HF circuit board, on which at least one antenna part is located, with a housing part, on which at least one second antenna part is located, and with a shielding cover, whereby the HF circuit board is installed between the housing part and the shielding cover. The present invention further relates to a method for assembling a HF module of this type.

A HF module of the type stated initially is used within the framework of short range radar (SRR) for motor vehicles. This radar functions as pulsed radar at 24,125 GHz and is used to determine the distance and speed of objects in traffic, e.g., for functions such as stop & go, precrash detection, blind spot detection, parking assistance and back-up assistance.

To ensure the function of high-frequency components on a circuit board and to suppress interference around other circuit parts, a metallized shielding cover is used in practice, the metallized shielding cover being pressed against the circuit board and sealed off using screws or clips, or by adhesive bonding, beading or hot-caulking, for example.

When a HF module of this type is assembled, the high-frequency components must be shielded well and the two antenna parts must be lined up with each other exactly. In addition, an economical joining technique which is as error-proof as possible must be used.

ADVANTAGES OF THE INVENTION

The present invention relates to measures that enable uncomplicated assembly of the high-frequency (HF) module, whereby the housing part and the shielding cover can be easily adjusted relative to the HF circuit board, and a reliable connection between these three parts can be achieved with relatively little outlay.

This is achieved according to the present invention by providing the HF circuit board with at least one through opening and equipping the housing part with at least one peg. The HF circuit board and the housing part are adjusted relative to each other and, as a result, so are the two antenna parts, by inserting the peg into the through opening. The connection between the housing part, the HF circuit board and the shielding cover is then produced via the peg, which is simply connected for this purpose with the diametrically opposed surface of the shielding cover.

Since the first antenna part is located on the HF circuit board and the second antenna part is connected with the housing part, the two antenna parts can be oriented relative to each other by using only the HF circuit board and the housing part. According to the present invention, it was recognized that the HF circuit board can be provided with through openings for this purpose, since these "non-HF-proof" openings can be easily shielded using the shielding cover, which must be provided anyway. In terms of the position of the through opening and/or openings, it must be ensured that the function of the HF circuit board is not impaired. It proves to be particularly advantageous to provide at least two through openings, since the HF circuit board and the housing part can be easily oriented relative to each other in this case in all three spacial directions. According to the present invention, it was also recognized that the peg or pegs which function as an adjusting aid can also be used to produce the connection between the three parts, i.e., the housing part, HF circuit board, and shielding cover, by connecting the peg with the shielding cover. Only one connecting step is required for this. The functionality of the antenna can then be checked before the HF module is assembled further.

As indicated previously in conjunction with the number of through openings in the HF circuit board and the number of pegs on the housing part, there are various possibilities for realizing the HF module according to the present invention and/or the method for assembling a HF module of this type according to the present invention.

In an advantageous variant, the pegs of the housing part are provided with a stop. When the HF module is assembled, the pegs are inserted in the corresponding through openings in the HF circuit board. The housing part is then pressed on the HF circuit board until the stop is reached, while the pegs are pressed against the shielding cover. The stop allows a defined distance between the housing part and the HF circuit board to be maintained in a simple manner, which is essential for the function of the antenna in particular. It also prevents the HF circuit board from being damaged during assembly of the HF module.

Both the housing part and the shielding cover are advantageously made of plastic, such as PBT. This plastic is metallized easily and has a low thermal expansion coefficient. PBT is also economical in price. It is particularly advantageous when the housing part is made of a plastic capable of being penetrated by laser beams, i.e., natural-colored or white PBT, for example, and the shielding cover is made of a plastic capable of being heated up by laser beams, i.e., black PBT, for example. In this case, the housing part and its peg and the shielding cover can be joined using laser full-penetration welding. In this process, the laser beam penetrates the peg material and warms the adjacent material of the shielding cover. As a result of the heat produced and with the application of corresponding contact pressure, the two plastic regions melt and form a permanent connection.

To seal the gaps between the HF circuit board and the shielding cover, it can be necessary to also connect the sealing cover with the HF circuit board using shielding adhesive or shielding dry seals. To this end, the shielding cover is dipped in the adhesive and/or the dry sealing mass before assembly. If adhesive is used, the HF module is cured in a furnace after assembly.

The surface of the shielding cover which is diametrically opposed to the peg of the housing part can be configured in different manners. With regard for good shielding of the through opening, it proves advantageous when a socket is configured in the surface of the shielding cover in the region of the through opening, the socket extending to the HF circuit board, at the least in its edge region. In this case, the peg must penetrate the HF circuit board completely so it can be connected with the socket and/or the socket surface. In another variant, the shielding cover is also equipped with peg-like projections, which are also inserted in the through openings of the circuit board and connected with the pegs of the housing part.

DRAWING

As explained extensively hereinabove, there are various possibilities for configuring and further developing the teaching of the present invention in advantageous fashion. To this end, reference is made to the claims which are subordinate to the independent claims, and to the following description of an exemplary embodiment of the invention with reference to the drawing.

Figure 2:
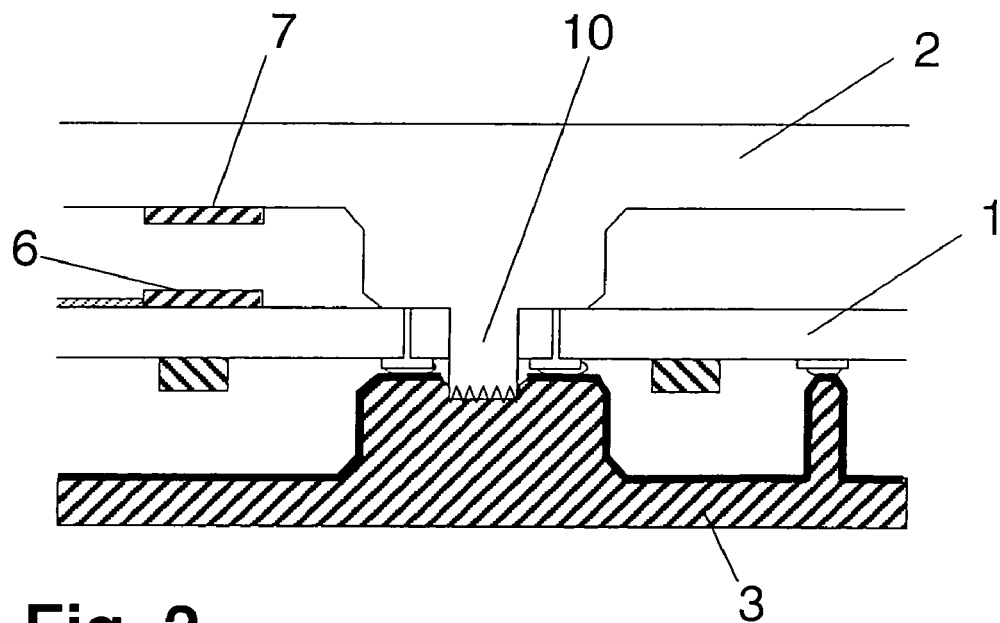

FIG. 1 shows the sectional drawing through a HF module according to the present invention, before assembly, and FIG. 2 shows the HF module shown in FIG. 1 after assembly.

DETAILED DESCRIPTION OF THE EMBODIMENT

The high-frequency (HF) module shown in the two figures is part of a short range radar for a motor vehicle. It includes a HF circuit board 1 as the central component, which is located between a housing part 2 serving as radome and a shielding cover 3 in the manner of a sandwich. Shielding cover 3 is metallized on both sides. The metal coating is labeled with numeral 4. Various components 5 are located on the underside of HF circuit board 1, the type and function of which will not be discussed further here. A first antenna part 6 is located on the top side of HF circuit board 1. This first antenna part 6 interacts with a second antenna part 7, which is located on the underside of housing part 2, which is diametrically opposed to first antenna part 6.

When assembling the three components of the HF module, i.e., HF circuit board 1, housing 2 and shielding cover 3, the two antenna parts 6 and 7 must be lined up with each other. To this end, a through opening 8 is configured in HF circuit board 1, which serves as an adjusting aid and does not impair the function of HF circuit board 1. Through contacts 9, called "vias" are located around through opening 8 and act as HF shields. A peg 10 is positioned on the underside of housing part 2 such that the two antenna parts 6 and 7 are lined up with each other as required when peg 10 is inserted in through opening 8. The vertical distance between the two antenna parts 6 and 7 is established by stop 11, which is configured on peg 10 and determines the maximum insertion depth of peg 10. In the exemplary embodiment presented here, peg 10 extends completely through HF circuit board 1 and projects out of its underside when it is inserted in through opening 8 until stop 11 is reached.

Shielding cover 3 has a socket 12 which is diametrically opposed to through opening 8 and has a raised circumferential edge 13. After the HF module is assembled, this circumferential edge 13 extends up to HF circuit board 1, while peg 10 is in blunt contact with socket surface 14, which is recessed relative to circumferential edge 13.

In this case, housing part 2 is made of a plastic capable of being penetrated by laser beams, such as natural-colored or white PBT. Shielding cover 3 is composed of a plastic capable of being heated up by laser beams, such as black or dark PBT, for example, so that peg 10 and socket surface 14 can be connected with each other using laser full-penetration welding. With this method, the laser beam penetrates the white material and warms the black plastic. The adjacent regions of peg 10 and socket 12 melt and form a permanent connection.

Before the HF module is assembled, shielding cover 3 is dipped in a conductive elastic adhesive 15, so that circumferential edge 13 and an inner partition 16 are provided with plastic 15. Instead of the adhesive, a shielding dry sealing material can also be used. Housing part 2, HF circuit board 1 and shielding cover 3 are then positioned one over the other, so that peg 10 penetrates through opening 8 and socket 12 borders through opening 8. The three components are then pressed together, so that peg 10 is pressed into through opening 8 and against socket surface 14 until stop 11 is reached. The three components of the HF module are then permanently joined with each other via welding peg 10 with socket surface 14. The HF module is then cured in the furnace. The furnace process is eliminated when dry seals are used.

What is claimed is:

1. A high-frequency (HF) module with a HF circuit board (1), on which at least one first antenna part (6) is located, with a housing part (2), on which at least one second antenna part (7) is located, and with a shielding cover (3), whereby the HF circuit board (1) is installed between the housing part (2) and the shielding cover (3), wherein the HF circuit board (1) includes at least one through opening (8), the housing part (2) has at least one peg (10) which extends into the through opening (8), and the peg (10) is connected with the diametrically opposed surface (14) of the shielding cover (3).

2. The HF module as recited in claim 1, wherein the peg (10) has a stop (11), and the peg (10) extends into the through opening (8) until this stop (11) is reached.

3. The HF module as recited in claim 1, wherein the housing part (2) is made of a plastic capable of being penetrated by laser beams, the shielding cover (3) is made of a plastic capable of being heated up by laser beams, and the housing part (2) and the shielding cover (3) are joined using laser full-penetration welding.

4. The HF module as recited in claim 1, wherein the shielding cover (3) is joined with the HF circuit board (1) using shielding adhesive (15) or shielding dry seals.

5. The HF module as recited in claim 1, wherein the shielding cover (3) includes at least one socket (12) which is located in the region of the through opening (8) of the HF circuit board (1) and extends, at least in its edge region (13), up to the HF circuit board (1), and the peg (10) of the housing part (2) is connected with the socket (12) of the shielding cover (3).

6. The HF module as recited in claim 1, wherein the shielding cover includes at least one peg-like projection, which also extends into the through opening of the circuit board, and the peg of the housing part is connected with the peg-like projection of the shielding cover.

7. The use of a HF module as recited in claim 1 within the framework of a short range radar, in particular for motor vehicle applications.

8. A method for assembling a HF module with a HF circuit board (1), on which at least one first antenna part (6) is located, with a housing part (2), on which at least one second antenna part (7) is located, and with a shielding part (3), whereby the HF circuit board (1) is installed between the housing part (2) and the shielding cover (3), wherein the HF circuit board (1) is provided with at least one through opening (8), and the housing part (2) is equipped with at least one peg (10), the HF circuit board (1) and the housing part (2) are adjusted relative to each other—and, as a result, so are the two antenna parts (6, 7)—by inserting the peg (10) into the through opening (8), and the peg (10) is connected with the diametrically opposed surface (14) of the shielding cover (3).

9. The method as recited in claim 8, wherein the housing part (2) is made of a plastic capable of being penetrated by laser beams, the shielding cover (3) is made of a plastic capable of being heated up by laser beams, and the housing part (2) and the shielding cover (3) are joined using laser full-penetration welding.

10. The method as recited in claim 7, wherein the shielding cover (3) is connected with the HF circuit board (1) using shielding adhesive (15) or shielding dry seals.

11. The method as recited in claim 8, wherein the peg (10) includes a stop (11), and the peg (10) is pressed into the through opening (8) until this stop (11) is reached.

* * * * *